United States Patent
Chen et al.

(10) Patent No.: US 8,581,319 B2
(45) Date of Patent: *Nov. 12, 2013

(54) SEMICONDUCTOR STACKS INCLUDING CATALYTIC LAYERS

(71) Applicant: Intermolecular, Inc., San Jose, CA (US)

(72) Inventors: Hanhong Chen, Milpitas, CA (US);
Sandra G. Malhotra, Fort Collins, CO (US); Hiroyuki Ode, Higashihiroshima (JP); Xiangxin Rui, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/738,901

(22) Filed: Jan. 10, 2013

(65) Prior Publication Data
US 2013/0140675 A1    Jun. 6, 2013

Related U.S. Application Data

(63) Continuation of application No. 13/153,691, filed on Jun. 6, 2011.

(51) Int. Cl.
*H01L 29/94*    (2006.01)

(52) U.S. Cl.
USPC ............................................. 257/306; 438/396

(58) Field of Classification Search
USPC ............................................. 257/306; 438/396
See application file for complete search history.

(56) References Cited

U.S. PATENT DOCUMENTS

2011/0136317 A1*   6/2011   Kang et al. .................... 438/396

* cited by examiner

*Primary Examiner* — Thao Le
*Assistant Examiner* — Laura Dykes

(57) ABSTRACT

A method for fabricating a dynamic random access memory (DRAM) capacitor includes forming a first electrode layer, forming a catalytic layer on the first electrode layer, optionally annealing the catalytic layer, forming a dielectric layer on the catalytic layer, optionally annealing the dielectric layer, forming a second electrode layer on the dielectric layer, and optionally annealing the capacitor stack. Advantageously, the electrode layers are TiN, the catalytic layer is $MoO_{2-x}$ where x is between 0 and 2, and the physical thickness of the catalytic layer is between about 0.5 nm and about 10 nm, and the dielectric layer is $ZrO_2$.

17 Claims, 3 Drawing Sheets

SEMICONDUCTOR STACKS INCLUDING CATALYTIC LAYERS

CROSS-REFERENCE TO RELATED APPLICATIONS

This is a Continuation Application of U.S. patent application Ser. No. 13/153,691, filed on Jun. 6, 2011, which is herein incorporated by reference for all purposes.

This document relates to the subject matter of a joint research agreement between Intermolecular, Inc. and Elpida Memory, Inc

FIELD OF THE INVENTION

The present invention relates generally to semiconductor processing. More specifically, a method for enhancing the deposition rate of $ZrO_2$ using atomic layer deposition (ALD) is described.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid high leakage current caused by tunneling mechanisms, which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Zirconium dioxide ($ZrO_2$) is a metal oxide dielectric material which displays significant promise in terms of serving as a high-k dielectric material for implementation in DRAM capacitors.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

Generally, a deposited thin film may be amorphous, crystalline, or a mixture thereof. Furthermore, several different crystalline phases may exist. Therefore, processes (both deposition and post-treatment) must be developed to maximize the formation of the desired crystalline phase and to minimize the presence of unwanted phases. The DRAM electrode materials and dielectric materials may be formed using any common formation technique such as atomic layer deposition (ALD), plasma enhanced atomic layer deposition (PE- ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

The capacitance of a DRAM capacitor can be increased by increasing the area of the capacitor plates as illustrated in Eqn. 1 above. This is a common technique used in the design of MIM capacitor structures and results in structures with severe morphologies. Examples of typical DRAM MIM structures include deep tranches, stacked structures, fin-type structures, crown-type structures, etc. The step coverage (a measure of film thickness uniformity) must be very good for both the electrode materials and the dielectric materials over these severe morphologies. Therefore, ALD, PE-ALD, AVD, UV-ALD, and CVD are preferred methods of deposition of these materials. Advantageously, ALD is a preferred method of deposition.

A disadvantage with most ALD deposition technologies is that the deposition rate of the materials is slow. A typical ALD technology comprises the steps of exposing a surface to a first precursor to form a monolayer of an adsorbed species. The process chamber is then purged and a second reactive gaseous species is introduced into the process chamber to react with the first precursor and form the desired material. The process chamber is then purged again and the cycle is repeated until the desired material thickness is reached. The surface coverage of the monolayer of the first precursor is rarely 100% and the apparent deposition rate per ALD cycle can be less than 0.1 nm per cycle. The apparent deposition rate is calculated by repeating the ALD cycle a number of times and then measuring the resultant film thickness. The slow deposition rate for ALD technologies adds time and expense to the manufacture of DRAM devices.

The use of $ZrO_2$ as a high-k dielectric material in DRAM capacitors is generally paired with the use of TiN as the electrode material. This combination works well because TiN has high conductivity, a high work function (4.7 eV), and does not interact with the $ZrO_2$ to form unwanted interfacial layers. However, the deposition rate of $ZrO_2$ on TiN using ALD technologies is slow (~0.8 nm/cycle in the case of the ZrM-CTA precursor). This adds time and cost to the manufacture of DRAM devices using $ZrO_2$ as the high-k dielectric material and TiN as the electrode material.

Therefore, there is a need to develop methods for improving the deposition rate of a $ZrO_2$ high-k dielectric material in a DRAM capacitor without degrading the performance of the capacitor.

SUMMARY OF THE INVENTION

In some embodiments of the present invention, a second layer is first deposited on the electrode and enhances the deposition rate of the dielectric material. Herein, this second layer will be called a catalytic layer. The physical thickness of the catalytic layer generally ranges between about 0.5 nm and about 10 nm. The electrode may be any one of TiN, TaN, TiAlN, W, WN, Mo, $Mo_2N$, or others. Advantageously, the electrode layer is TiN. The dielectric layer may be any one of $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ SBT), $PbZrTiO_x$ (PZT) or doped versions of the same. Advantageously, the dielectric layer is doped $ZrO_2$. The catalytic layer comprises sub-oxides of $MoO_2$, $CrO_{2-x}$, $WO_{2-x}$, $MnO_{2-x}$ and can range from pure metal (x=2) up to metal dioxide (x=0). Advantageously, the catalytic layer is $MoO_{2-x}$. The deposition of the catalytic layer may use any one of ALD, PE-ALD, AVD, UV-ALD, CVD, PECVD, or PVD. Advantageously, the deposition of the catalytic layer uses ALD, PE-ALD, AVD, UV-ALD, or CVD.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
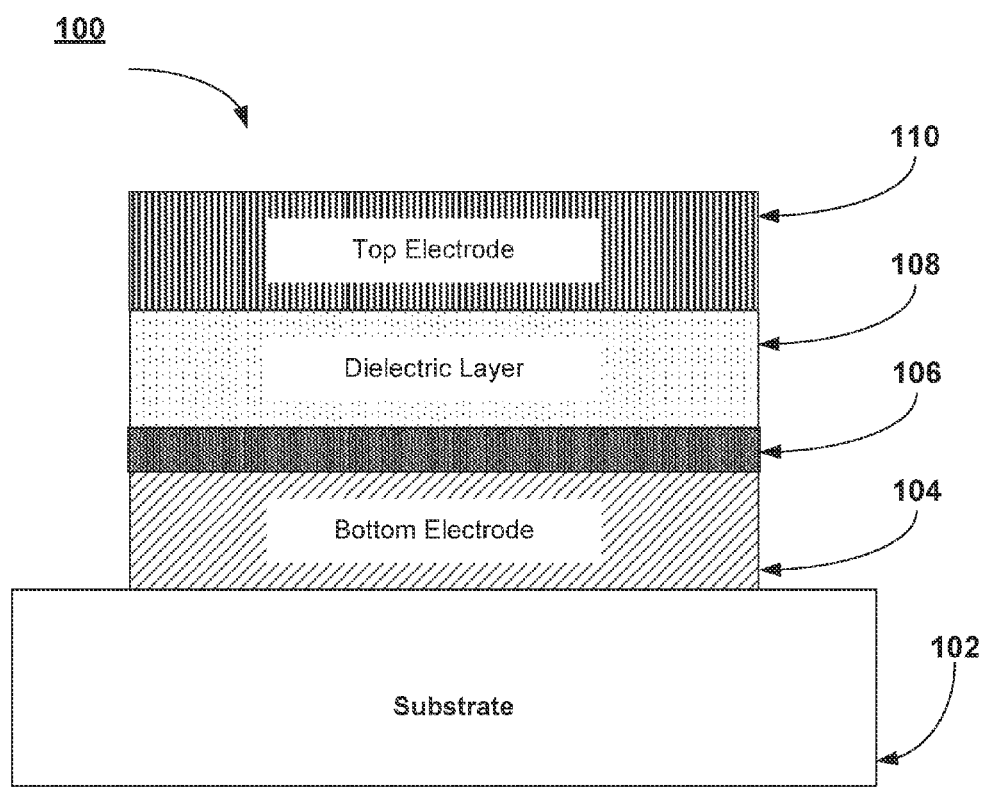
FIG. 1 illustrates a simplified cross-sectional view of a DRAM capacitor stack fabricated in accordance with some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The use of crystalline $ZrO_2$ as a high-k dielectric material in DRAM capacitors is attractive because of the k value of ~30 to 50 when the material is in the cubic or tetragonal phase. Because of the complex morphologies of the MIM capacitor structures as discussed earlier, the deposition of the $ZrO_2$ using ALD technologies is an area of active research. One important area of research is the development of new precursor molecules for the introduction of the Zr portion of the material. Tetrakis(ethylmethylamido)zirconium (Zr$(NEtMe)_4$) also known as "TEMAZ" has widely been adopted as the precursor of choice. However, the ALD deposition temperature range for this precursor is less than 220 C. TEMAZ is typically used with $O_3$ as an oxidizer to deposit $ZrO_2$ as a high-k dielectric material. It is desirable to develop ALD precursors with higher deposition ranges because this generally raises the k value and results in a lower equivalent oxide thickness (EOT). The apparent ALD deposition rate of $ZrO_2$ using TEMAZ and $O_3$ on TiN at about 210 C is about 0.14 nm per cycle.

Recently, new cyclopentadienyl (Cp, $C_5H_5$)-type precursors have been developed for the deposition of $ZrO_2$ high-k materials. Two such precursors are $CpZr(NMe_2)_3$ "ZyALD" (a trademark of Air Liquide with headquarters in Paris, France) and (MeCp)Zr(NMe$_2$)$_3$ "ZrMCTA". These precursors are more stable than TEMAZ and have higher ALD temperature ranges. However, their apparent ALD deposition rates are lower than that of TEMAZ. For example, the apparent ALD deposition rate using the ZyALD precursor at 260 C on TiN is 0.085 nm per cycle and using the ZrMCTA precursor at 260 C on TiN is 0.08 nm per cycle.

In some embodiments of the present invention, a second electrode layer on top of the first electrode layer is used to increase the apparent deposition rate of a dielectric layer on an electrode. The second electrode layer comprises MoO$_{2-x}$ and is hereafter defined as a "catalytic layer". The physical thickness of the catalytic layer generally ranges between about 0.5 nm and about 10 nm. The catalytic layer improvement in the apparent deposition rate has been confirmed for ALD and PVD deposition technologies for ZrO$_2$ dielectric layers. For example, the presence of a MoO$_{2-x}$ catalytic layer can result in an apparent deposition rate increase of about 2x. Additionally, the catalytic layer improvement in the apparent deposition rate has been confirmed for ALD deposition technologies for TiO$_2$ dielectric layers. Therefore, it is believed that the catalytic effect will extend to the deposition of other common high-k dielectric materials as many of the common high-k dielectric materials are deposited from organometallic precursors with similar functional groups. As such, their chemical reaction pathways should be similar. Two possible mechanisms that may account for the catalytic behavior are that the sticking coefficient of the precursor may be higher on the MoO$_{2-x}$ surface than on the bare electrode leading to enhanced surface coverage and a higher deposition rate, or there may be a catalytic effect due to the chemical interaction of the MoO$_{2-x}$ surface and the functional groups of the dielectric precursor.

FIG. 1 illustrates a simple capacitor stack, 100, consistent with some embodiments of the present invention. The capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

The capacitor structure comprises a substrate, 102, and a first electrode, 104. The first electrode is typically a metal such as TiN, TaN, TiAlN, W, WN, Mo, Mo$_2$N, or others. Advantageously, the first electrode is TiN. The first electrode is formed on substrate, 102, and is typically between about 5 nm and about 50 nm in thickness.

Catalytic layer, 106, is formed on the first electrode. Advantageously, the catalytic layer is MoO$_{2-x}$ where x is between 0 and 2. Typically, the catalytic layer is between about 0.5 nm and about 10 nm in thickness. Optionally, the MoO$_{2-x}$ catalytic layer can be annealed before the subsequent dielectric layer is deposited. The MoO$_{2-x}$ catalytic layer can be annealed in an inert atmosphere such as N$_2$ or Ar or the MoO$_{2-x}$ catalytic layer can be annealed in a reducing atmosphere such as forming gas (a mixture of H$_2$ in N$_2$). One example of such an annealing process is further described in U.S. application Ser. No. 13/084,666 filed on Apr. 12, 2011, entitled "METHOD FOR FABRICATING A DRAM CAPACITOR" and is incorporated herein by reference. The annealing process crystallizes the MoO$_{2-x}$ catalytic layer and ensures that there are no oxygen-rich phases present. However, it is believed that an amorphous MoO$_{2-x}$ layer would also increase the deposition rate of the dielectric layer. The catalytic layer also serves to protect the underlying first electrode from oxidation during the subsequent formation of the dielectric layer. This is especially advantageous if the first electrode layer is TiN and the subsequent dielectric layer uses one of the new higher temperature precursors with O$_3$ as discussed earlier.

In this discussion, MoO$_{2-x}$ has been used as the example of the catalytic layer. However, it is believed that other metal oxides such as CrO$_{2-x}$, WO$_{2-x}$, MnO$_{2-x}$ or the like may also be effective because their chemistries are generally similar to MoO$_{2-x}$. Cr and W are in the same group of the periodic table as Mo and therefore share similar chemical properties. Mn is in the group of the periodic table that is next to Cr, Mo, and W and is known to also have similar chemical properties. Additionally, high work function (>~4 eV) conductive metal oxide materials should be good candidates as a material to be incorporated into the capacitor electrode structure.

Dielectric layer, 108, is then formed on the catalytic layer. Examples of suitable dielectric materials comprise SiO$_2$, a bilayer of SiO$_2$ and Si$_x$N$_y$, SiON, Al$_2$O$_3$, HfO$_2$, HfSiO$_x$, ZrO$_2$, Ta$_2$O$_5$, TiO$_2$, SrTiO$_3$ (STO), SrBaTiO$_x$ (SBT), PbZrTiO$_x$ (PZT) or doped versions of the same. It is expected that these dielectric materials will also exhibit an enhanced deposition rate when deposited on the catalytic layer since they are deposited from organometallic precursors with similar functionalities as discussed previously. The dielectric layer may be homogeneous or may be doped. If the dielectric layer is doped, the concentration of the dopant may be uniform or may be non-uniform within the dielectric layer. Additionally, the dielectric layer may be a single film or may be formed from stacks or nanolaminates of several different films. Advantageously, the dielectric layer comprises a doped ZrO$_2$ or a doped TiO$_2$ material. The dielectric layer is typically between about 6 nm and 8 nm in thickness. Optionally, dielectric layer, 108, can receive a post dielectric anneal (PDA) treatment. The PDA treatment serves to crystallize the dielectric layer and ensure that the material is fully oxidized.

Second electrode, 110, is then formed on dielectric layer, 108. The second electrode is typically a metal such as TiN, TaN, TiAlN, W, WN, Mo, Mo$_2$N, or others. Advantageously, the second electrode is TiN. The second electrode is typically between about 5 nm and 50 nm in thickness. Typically, the capacitor stack is then subjected to a post metallization anneal (PMA) treatment. The PMA treatment serves to crystallize the second electrode and to anneal defects and interface states that are formed at the dielectric/second electrode interface during the deposition. Also, if there is no PDA treatment done before metallization, PMA treatment can serve to crystallize the dielectric layer. Examples of the PDA and PMA treatments are further described in U.S. application Ser. No. 13/159,842 filed on Jun. 14, 2011, which is incorporated herein by reference for all purposes.

In some embodiments of the present invention, the catalytic layer is MoO$_{2-x}$, where x is between 0 and 2, and the layer is formed using an ALD technology. To control the composition of the layer, the reactive gas pulse of the ALD cycle is an oxidizer. The oxidizer may be any one of O$_2$, O$_3$, H$_2$O, NO, N$_2$O, H$_2$O$_2$, an alcohol, an alkoxide, or combinations thereof. Typically, the oxidizer is O$_3$. The oxidizer concentration and pulse time would be selected so that the adsorbed Mo precursor is not fully oxidized. This ensures that the final material composition will be a sub-oxide of MoO$_2$. Alternatively, pure layers of Mo (i.e. no oxidation pulses) can be interspersed within a number of MoO$_2$ layers to ensure that the final material composition will be a sub-oxide of MoO$_2$ after annealing.

In some embodiments of the present invention, the catalytic layer is MoO$_{2-x}$, where x is between 0 and 2, and the layer is formed using a PVD technology. To control the composition of the layer, the reactive gas introduced during the PVD process is an oxidizer. The oxidizer may be any one of $O_2$, $O_3$, $H_2O$, NO, $N_2O$, $H_2O_2$, an alcohol, an alkoxide, or combinations thereof. Typically, the oxidizer is $O_2$. The oxidizer concentration would be selected so that the deposited Mo layer is not fully oxidized to form trioxide $MoO_{2+x}$ ($0<x<1$). This ensures that the final material composition will be a sub-oxide of $MoO_2$. Alternatively, pure layers of Mo (i.e. no oxidation gas) can be interspersed within a number of $MoO_2$ layers to ensure that the final material composition will be a sub-oxide of $MoO_2$ after annealing.

ALD and PVD are two examples of deposition technologies that may be used to form the catalytic layer. Those skilled in the art will appreciate that the description and teachings can be readily applied to any known deposition technology. These examples are for illustrative purposes only and do not limit the application of the present invention.

Figure 2:
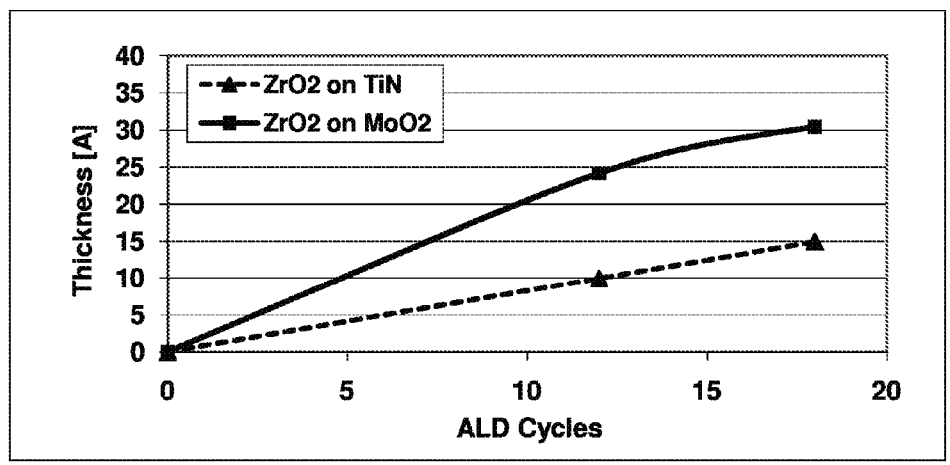
FIG. 2 presents data illustrating the improved deposition rate of $ZrO_2$ over a TiN electrode with a $MoO_{2-x}$ catalytic layer versus the deposition rate without the catalytic layer.

FIG. 2 presents data illustrating the improved deposition rate of $ZrO_2$ over a TiN electrode with a $MoO_{2-x}$ catalytic layer versus the deposition rate without the catalytic layer. The data indicate that the deposition rate with the catalytic layer is about double that of the standard process (i.e. without the catalytic layer). This trend has been confirmed for several of the Zr precursors listed above and for the deposition of $TiO_2$ using ALD. As discussed earlier, it is believed that the sticking coefficient of the Zr precursor is higher on the $MoO_{2-x}$ surface leading to enhanced surface coverage and a higher deposition rate. Additionally, there may be an added catalytic effect due to the chemical interaction of the $MoO_{2-x}$ surface and the Zr precursor.

Figure 3:
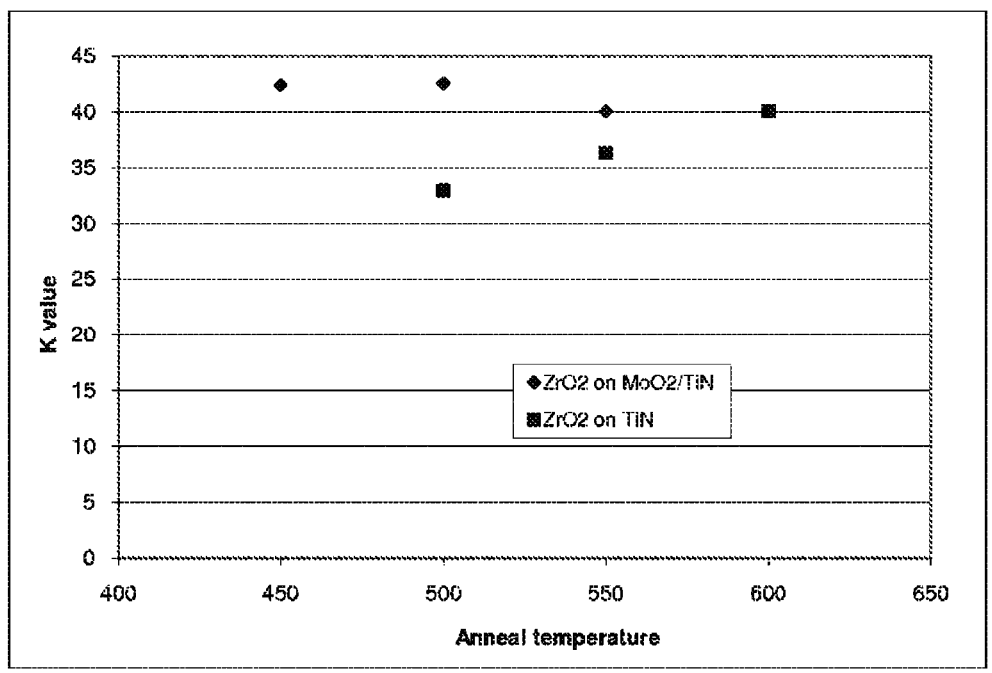
FIG. 3 presents data for the measured k value for a $ZrO_2$ high-k dielectric material deposited over a TiN electrode with a $MoO_{2-x}$ catalytic layer versus the measured k value without the catalytic layer as a function of post metallization anneal temperature.

FIG. 3 presents data for the measured k value for a $ZrO_2$ high-k dielectric material deposited over a TiN electrode with a $MoO_{2-x}$ catalytic layer versus the measured k value without the catalytic layer as a function of post dielectric anneal temperature. The k value of the $ZrO_2$ dielectric is higher and more consistent over the various anneal temperatures when deposited on the $MoO_{2-x}$ catalytic layer. It is believed that the $MoO_{2-x}$ catalytic layer exists with a crystalline $MoO_2$ phase. $MoO_2$ has a distorted rutile crystal structure and would promote the growth of the high-k tetragonal phase of $ZrO_2$.

A DRAM capacitor stack has been formed using the methods described above. A TiN first electrode with a thickness of 50 nm was deposited on a substrate. A $MoO_{2-x}$ catalytic layer was formed on the TiN first electrode by PVD using $O_2$ mixed with Ar as the reactive gas with a thickness of 20 nm. The $MoO_{2-x}$ catalytic layer was annealed in forming gas (10% $H_2$ in $N_2$) at 500 C for 10 minutes. A $ZrO_2$ dielectric layer was formed on the catalytic layer by ALD with a thickness of 10.5 nm. A Ru second electrode was formed on the $ZrO_2$ dielectric layer with a thickness of 50 nm by PVD. Ru was chosen as the second electrode because its high conductivity is stable in the oxygen ambient of the subsequent PMA treatment. The capacitor stack was annealed in a dilute $O_2$ (4% $O_2$ in $N_2$) atmosphere at 460 C for 10 minutes. The $ZrO_2$ dielectric exhibited a k value of 40 and the capacitor exhibited a leakage current of $2.1 \times 10^{-7}$ A $cm^2$ at 1 V.

A DRAM capacitor stack has been formed using the methods described above. A TiN first electrode with a thickness of 50 nm was deposited on a substrate. A $MoO_{2-x}$ catalytic layer was formed on the TiN first electrode by PVD using $O_2$ mixed with Ar as the reactive gas with a thickness of 20 nm. The $MoO_{2-x}$ catalytic layer was annealed in forming gas (10% $H_2$ in $N_2$) at 500 C for 10 minutes. A doped $ZrO_2$ dielectric layer (20 atomic % Al) was formed on the catalytic layer by ALD with a thickness of 9.3 nm. A Ru second electrode was formed on the $ZrO_2$ dielectric layer with a thickness of 50 nm by PVD. Ru was chosen as the second electrode because its high conductivity is stable in the oxygen ambient of the subsequent PMA treatment. The capacitor stack was annealed in a dilute $O_2$ (4% $O_2$ in $N_2$) atmosphere at 460 C for 10 minutes. The doped $ZrO_2$ dielectric exhibited a k value of 23 and the capacitor exhibited a leakage current of $2.5 \times 10^{-8}$ A $cm^2$ at 1 V Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
   a first electrode layer formed on a substrate;
   a catalytic layer formed on the first electrode layer,
      wherein the catalytic layer comprises one or more layers of unoxidized molybdenum interspersed with one or more layers of $MoO_2$;
   a dielectric layer formed on the catalytic layer; and
   a second electrode layer formed on the dielectric layer.

2. The semiconductor layer stack of claim 1, wherein the first electrode layer comprises one of TiN, TaN, TiAlN, W, WN, Mo, or $Mo_2N$.

3. The semiconductor layer stack of claim 2, wherein the first electrode layer comprises TiN.

4. The semiconductor layer stack of claim 1 wherein the catalytic layer has a physical thickness between about 0.5 nm and about 10 nm.

5. The semiconductor layer stack of claim 1, wherein the dielectric layer comprises one of $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT) or doped versions of the same.

6. The semiconductor layer stack of claim 5, wherein the dielectric layer comprises one of $ZrO_2$ or $TiO_2$.

7. The semiconductor layer stack of claim 1, wherein the second electrode layer comprises one of TiN, TaN, TiAlN, W, WN, Mo, or $Mo_2N$.

8. The semiconductor layer stack of claim 7, wherein the second electrode layer comprises TiN.

9. The semiconductor layer stack of claim 1, wherein the first electrode layer comprises TiN, wherein a physical thickness of the catalytic layer is between about 0.5 nm and about 10 nm, wherein the dielectric layer comprises $ZrO_2$, and wherein the second electrode layer comprises TiN.

10. The semiconductor layer stack of claim 1, wherein the dielectric layer comprises $ZrO_2$.

11. The semiconductor layer stack of claim 1, wherein the first electrode has a thickness of between about 5 nm and 50 nm.

12. The semiconductor layer stack of claim 1, wherein the catalytic layer comprises no oxygen-rich phases.

13. The semiconductor layer stack of claim 1, wherein the catalytic layer comprises a crystalline phase.

14. The semiconductor layer stack of claim 1, wherein the dielectric layer further comprises a dopant.

15. The semiconductor layer stack of claim 14, wherein the dopant is non-uniformly distributed throughout the dielectric layer.

16. The semiconductor layer stack of claim 1, wherein the dielectric layer comprises a nanolaminate of different films.

17. The semiconductor layer stack of claim 1, wherein the dielectric layer has a thickness of between about 6 nm and 10 nm.

* * * * *